(12) United States Patent  
Burdine (10) Patent No.: US 7,107,502 B2
(45) Date of Patent: Sep. 12, 2006

(54) DIAGNOSTIC METHOD FOR DETECTION OF MULTIPLE DEFECTS IN A LEVEL SENSITIVE SCAN DESIGN (LSSD)

(75) Inventor: Todd Michael Burdine, Wappingers Falls, NY (US)

(73) Assignee: International Business Machines Corporation, Armonk, NY (US)

(*) Notice: Subject to any disclaimer, the term of this patent is extended or adjusted under 35 U.S.C. 154(b) by 307 days.

(21) Appl. No.: 10/767,046

(22) Filed: Jan. 29, 2004

(65) Prior Publication Data
US 2005/0172188 A1 Aug. 4, 2005

(51) Int. Cl.
*G01R 31/28* (2006.01)
*G06F 17/50* (2006.01)
(52) U.S. Cl. ............... 714/726; 714/30; 716/4
(58) Field of Classification Search ............ None
See application file for complete search history.

(56) References Cited

U.S. PATENT DOCUMENTS 6,442,720 B1 * 8/2002 Koprowski et al. ......... 714/726
2003/0131294 A1 * 7/2003 Motika et al. .............. 714/718

OTHER PUBLICATIONS

"A Technique for Fault Diagnosis of Defects in Scan Chains" by Guo et al, IEEE, paper 10.2, pp. 268-277, 2001.*

* cited by examiner

*Primary Examiner*—Phung My Chung
(74) *Attorney, Agent, or Firm*—Fleit, Kain, Gibbons, Gutman, Bongini & Bianco, P.L.

(57) ABSTRACT

Examiner's permission under MPEP §608.01(q) and 37 CFR §1.125(b) is requested to submit a substitute specification and abstract. The substitute specification corrects typographical errors, grammar and formatting. No new matter has been added. The substitute specification and abstract contain no new matter to the specification of record. A marked-up version is attached along with a clean version in an appendix attached hereto.

22 Claims, 10 Drawing Sheets

PRIOR ART

| INPUT | RML8 | | RML7 | | RML6 | | RML5 | | RML4 | | RML3 | | RML2 | | RML1 | |
|---|---|---|---|---|---|---|---|---|---|---|---|---|---|---|---|---|
| | L1 | L2 | L1 | L2 | L1 | L2 | L1 | L2 | L1 | L2 | L1 | L2 | L1 | L2 | L1 | L2 |
| 1120 LOAD L1 AND L2 WITH ZERO'S | 0 | 0 | 0 | 0 | 0 | 0 | 0 | 0 | 0 | 0 | 0 | 0 | 0 | 0 | 0 | 0 |
| 1122 SWITCH TO FAILING REGION | 0 | 0 | 0 | 0 | 0 | 0 | 0 | 1 | 0 | 1 | 0 | 1 | 0 | 0 | 0 | 0 |
| 1124 CLOCK A | 0 | 0 | 0 | 0 | 0 | 0 | 1 | 0 | 1 | 0 | 1 | 1 | 1 | 0 | 0 | 0 |
| 1126 SWITCH TO OPERATING REGION | 0 | 0 | 0 | 0 | 0 | 0 | 0 | 0 | 1 | 1 | 1 | 0 | 1 | 0 | 0 | 0 |
| 1128 CLOCK B | 0 | | | | | | 0 | 0 | 1 | 1 | 1 | 1 | 1 | 1 | 0 | 0 |
| 1130 UNLOAD L2 | | 0 | | 0 | | 0 | | 0 | | 1 | | 1 | | 1 | | 0 |

| INPUT | RML8 1202 | | RML7 1204 | | RML6 1206 | | RML5 1208 | | RML4 1210 | | RML3 1212 | | RML2 1214 | | RML1 1216 | |
|---|---|---|---|---|---|---|---|---|---|---|---|---|---|---|---|---|
| | L1 | L2 | L1 | L2 | L1 | L2 | L1 | L2 | L1 | L2 | L1 | L2 | L1 | L2 | L1 | L2 |
| LOAD L1 AND L2 WITH ZERO'S 1220 | 0 | 0 | 0 | 0 | 0 | 0 | 0 | 0 | 0 | 0 | 0 | 0 | 0 | 0 | 0 | 0 |
| SWITCH TO FAILING REGION 1222 | 0 | 0 | 0 | 0 | 0 | 0 | 1 | 0 | 1 | 0 | 1 | 0 | 0 | 0 | 0 | 0 |
| CLOCK B 1224 | 0 | 0 | 0 | 0 | 0 | 0 | 1 | 1 | 1 | 1 | 1 | 1 | 0 | 0 | 0 | 0 |
| SWITCH TO OPERATING REGION 1226 | 0 | 0 | 0 | 0 | 0 | 0 | 0 | 1 | 1 | 1 | 0 | 1 | 0 | 0 | 0 | 0 |
| UNLOAD L2 1228 | | 0 | | 0 | | 0 | | 1 | | 1 | | 1 | | 0 | | 0 |

FIG. 12 1200

DIAGNOSTIC METHOD FOR DETECTION OF MULTIPLE DEFECTS IN A LEVEL SENSITIVE SCAN DESIGN (LSSD)

FIELD OF THE INVENTION

This invention relates to a method of diagnostic testing of digital circuitry and more specifically to testing and diagnosing scan chain failures to failing data retaining circuit elements.

BACKGROUND OF INVENTION

Electronic circuits are increasingly being optimized for lower power and smaller size requirements for better incorporation into integrated circuit designs. The increase in complexity and gate count within integrated circuits also requires that electrical circuit testability be addressed in the designs of integrated circuits. One general methodology of integrated circuit testability is referred to as Level Sensitive Scan Design (LSSD). A LSSD circuit complies with a set of design rules that enhances the observability and controllability of digital circuit elements so as to enhance testability of a complex digital design circuit.

Figure 1:
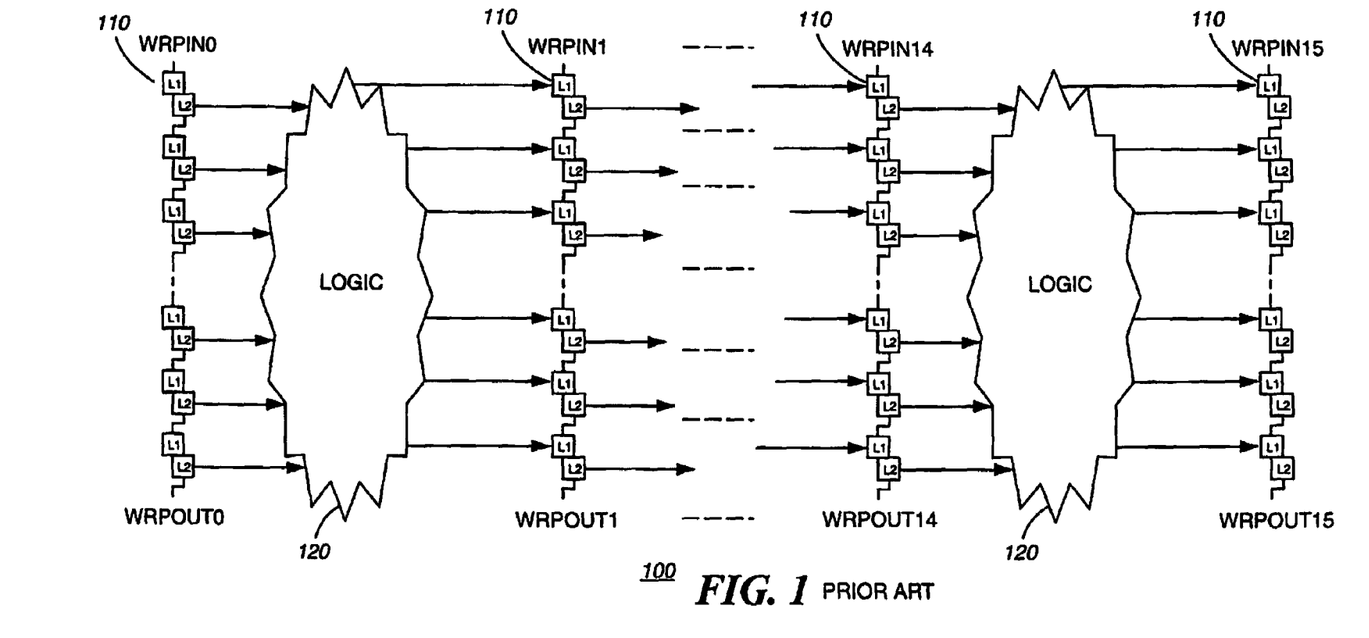
FIG. 1 is a prior art block diagram of an exemplary Level Sensitive Scan Design (LSSD) circuit.

In a LSSD design, scan chains provide access and testing for the internal circuits of large-scale integrated (LSI) circuits, very large scale integrated (VLSI) circuits, and other integrated circuits. The scan chains can be configured as one long chain or multiple short chains. FIG. 1 illustrates a block diagram of an exemplary LSSD design circuit 100 The exemplary LSSD design circuit 100 includes multiple scan chains 110 interfacing with the logic circuitry 120.

Figure 2:
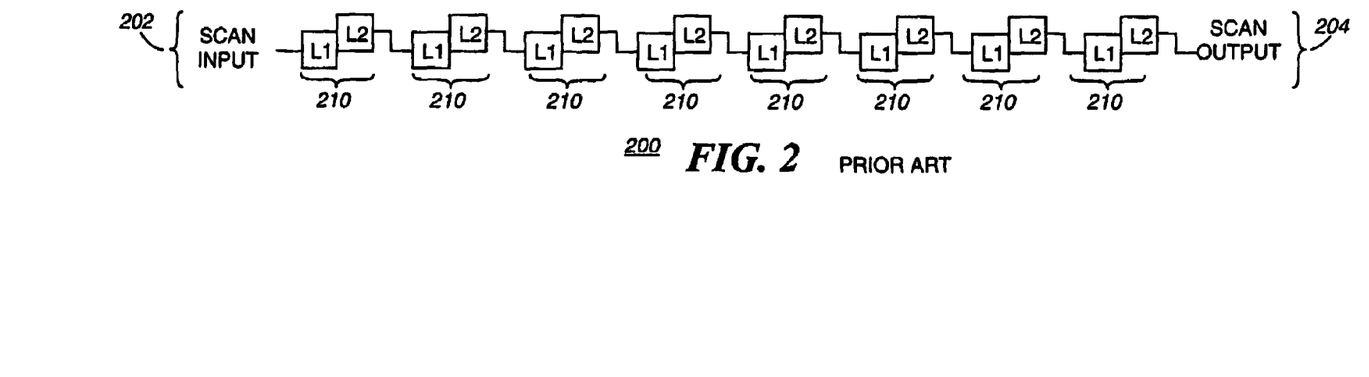
FIG. 2 is a prior art block diagram of an exemplary scan chain circuit, which is generally comprised of a series of shift register latch blocks or data storage elements.

FIG. 2 is a block diagram of a scan chain 110. The scan chain 110 generally includes a set of shift register latch blocks or data storage elements 210 connected in a series configuration.

These latch blocks 210 incorporate a design that allows data to be loaded into a shift register through an alternate data input. This alternate input is generally used for circuit test and stimulation and is sometimes referred to as a "scan input" since it allows a pre-defined state to be "scanned" into the sequential circuit using these register latch blocks. Loading a latch block with a particular value allows, for example, placing a sequential logic circuit into a desired state.

Figure 3:
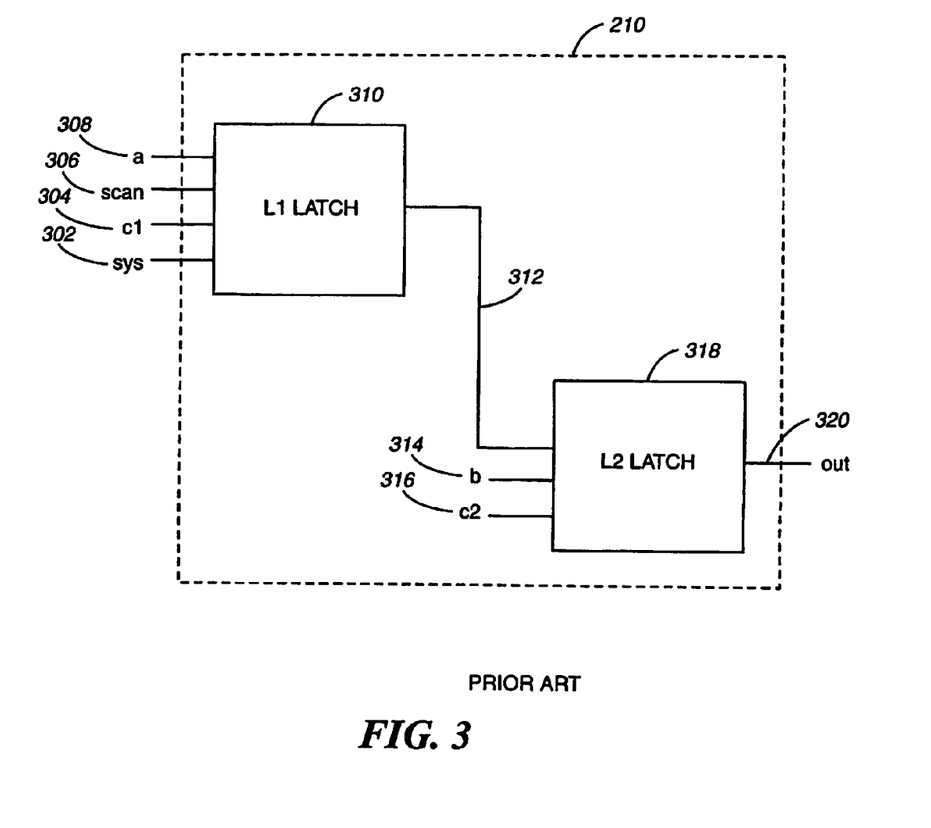
FIG. 3 is a prior art block diagram of a shift register latch block or data storage element.

FIG. 3 is a block diagram of a typical latch block 210. The latch block 210 or shift register latch includes a pair of latches L1 and L2 where L1 310 is the "master" latch and L2 318 is the "slave" latch. The L1 latch or master latch 310 has two data ports, a system input port SYS 302 and an alternate data input port SCAN 306 and may be updated by either a functional clock C1 304 or a scan clock A 308.

In normal operation of the shift register block 210, data is provided on the system input port SYS 302 and this data value is selected for storage into latch L1 310 upon a transition of the functional clock C1 304 from low to high. The shift register block 210 is also able to select for storage data from the alternate data input port SCAN 306 by providing a data value on the alternate data input port SCAN 306 and then causing this value to be stored into latch L1 310 upon a transition of the scan clock "a" 308. Once a data value is stored in L1 310, this value is available, after a propagation delay, at the L1 Output 312. The logical value that is present on the L1 Output 312 is stored into latch L2 318 upon a transition of shift clock "b" 314 (or shift clock c2) from a logical low level to a logical high level. After the L1 Output 312 is stored into the L2 latch or slave latch 318 that logic value is available, after a propagation delay, on the L2 output 320.

A scan chain provides access to the internal parts of a chip and its function is critical in testing a chip. A problem arises, however, when a scan chain fails. Often scan chain fallout occurs early in the life cycle for new chip technology development, and quickly diagnosing any scan fails is critical to improving the process so that targeted manufacturing yield levels can be achieved.

Generally, scan chain fails can be divided into two categories: DC defects and broken. A broken scan chain is one that will not operate under any conditions (e.g., voltage, frequency, temperature). A scan chain containing DC defects will only operate under certain conditions (e.g., only between 1.2V and 1.3V). The condition or conditions under which a scan chain operates or fails will be referred to as the "operating region" and "failing region", respectively.

One method provides some success in diagnosing and locating a first failed register latch in a scan chain. This method contains the steps of loading the scan chain in the operating region, and unloading the scan chain in the failing region.

Another method provides some success in diagnosing and locating a last failed register latch in a scan chain. This method contains the steps of loading the scan chain in the failing region, and unloading the scan chain in the operating region.

Figure 4:
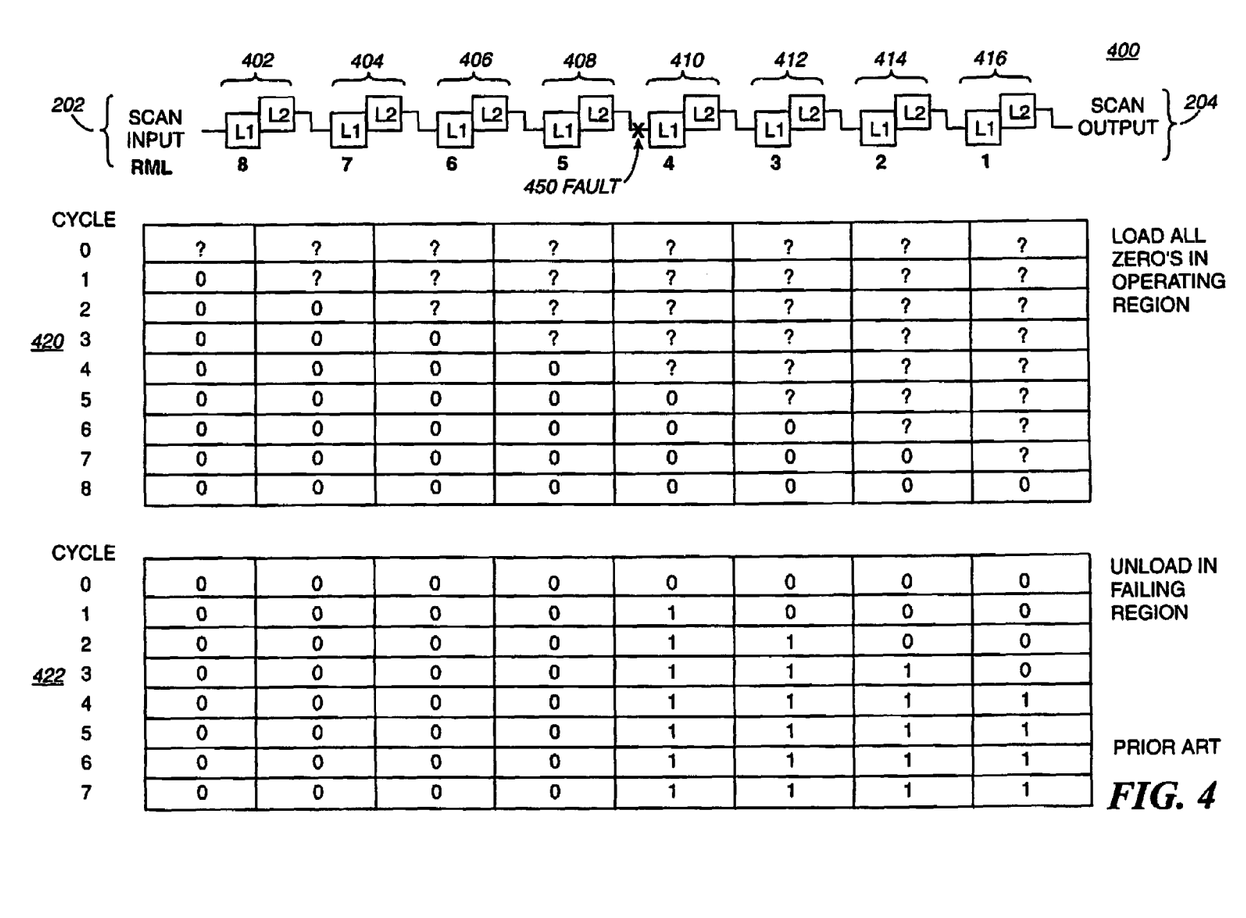
FIG. 4 is a block diagram of an exemplary scan chain circuit with a DC defect at the output of RML 5 being scanned with a first prior art method.

To illustrate these methods, consider the following example of a scan chain 400 consisting of eight latches as shown in FIG. 4. Assume there is a defect 450 at the output of RML5 408 that causes the chain to be stuck-at "1" in the failing region, where RML means "Register Measure Latch." Using the first method, the scan chain 400 is loaded with all zeroes (0's) in the operating region, resulting in the value of each latch to be a zero or RML(1:8)='00000000'. The propagation during each of the clock cycles (i.e. cycles 1–8) across the scan chain 400 from scan input 202 is shown in block 420. Next, the scan chain 400 is switched into the failing region and unloaded. The following data is attained: RML(1:8)='00001111'. From this data, it may be diagnosed that the DC fail occurs on RML5 408. The output taken from scan output 204 is shown in block 422 after all of the input value of zero has propagated through the scan chain 400.

Figure 5:
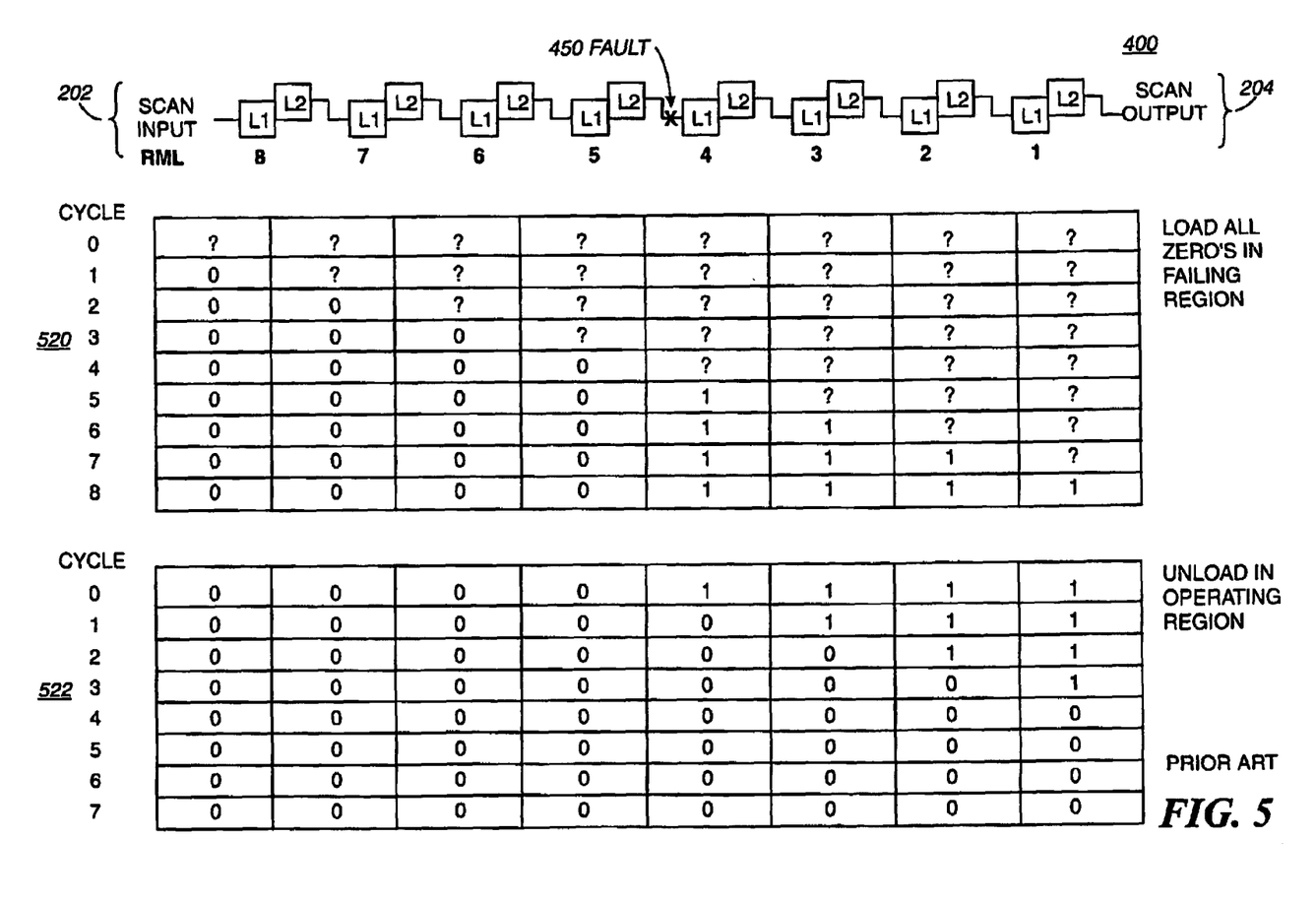
FIG. 5 is a block diagram of an exemplary scan chain circuit with a DC defect at the output of RML 5 being scanned with a second prior art method.

To illustrate the second prior art method shown in FIG. 5 is a block diagram of an exemplary scan chain circuit with a DC defect 450 again at the output of RML 5 being scanned. Using the second method, the scan chain 400 is loaded with all zeroes (0's) in the failing region, resulting in RML(1:8) ='11110000'. The propagation during each of the clock cycles (i.e. cycles 1–8) across the scan chain 400 from scan input 202 is shown in block 520. Next, the scan chain is switched into the operating region and unloaded. The following data is attained: RML(1:8)="11110000". The output taken from scan output 204 is shown in block 522 after all of the input value of zero has propagated through the scan chain 400. From this data, it may be diagnosed that the DC fail occurs on RML5 408.

Figure 6:
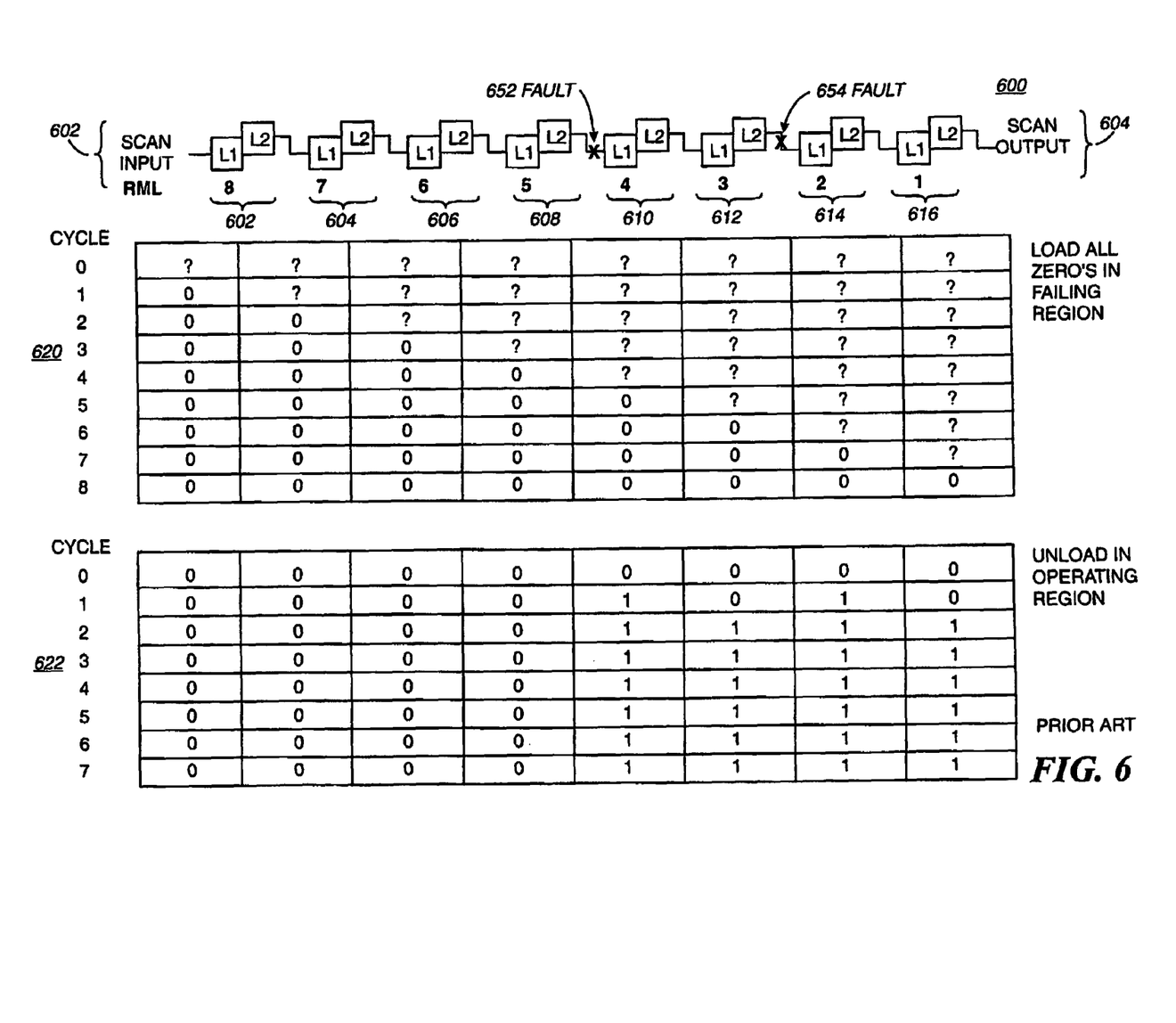
FIG. 6 is a block diagram of an exemplary scan chain circuit with two DC defects at the outputs of RML3 and RML5, respectively being scanned with a first prior art method.

Now consider the following example of a scan chain 600 consisting of eight latches with two DC defects 652 and 654 as shown in FIG. 6. Assume there are defects at the outputs of RML5 608 and RML3 612 that cause the chain to be stuck-at "1" in the failing region. Using the first method, the scan chain 600 is loaded with all zeroes (0's) in the operating region, resulting in the value of each latch to be a zero or RML(1:8)='00000000'. The propagation during each of the clock cycles (i.e. cycles 1–8) across the scan chain 600 from scan input 602 is shown in block 620. Next, the scan chain 600 is switched into the failing region and unloaded. The following data is attained: RML(1:8)='00111111'. The output taken from scan output 604 is shown in block 622 after all of the input value of zero has propagated through the scan chain 600. From this data, it may be diagnosed that the DC fail occurs on RML3 412.

Figure 7:
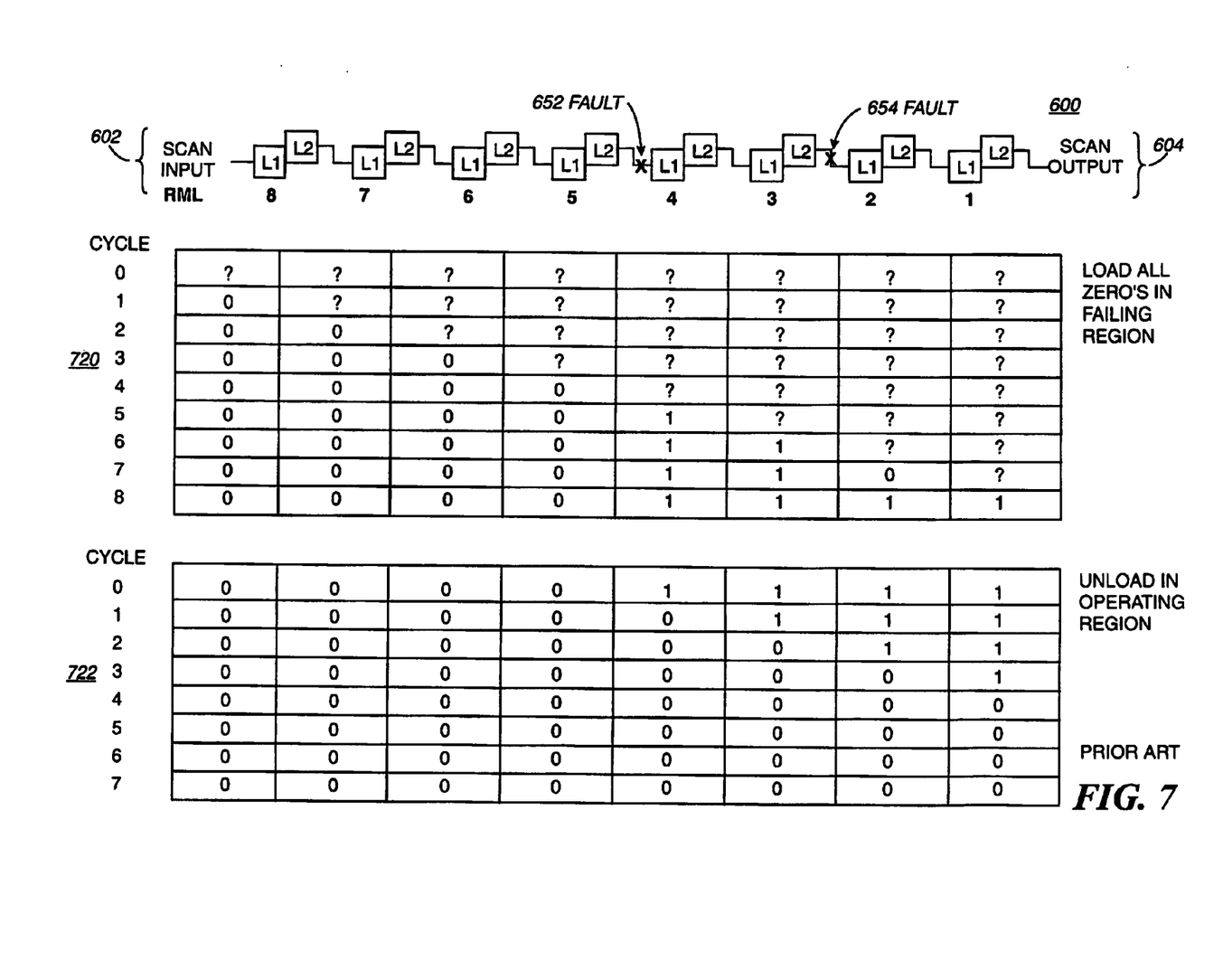
FIG. 7 is a block diagram of an exemplary scan chain circuit with two DC defects at the outputs of RML3 and RML5, respectively being scanned with a second prior art method

To illustrate the second prior art method shown in FIG. 7 is a block diagram of an exemplary scan chain circuit with a two DC defect 652 and 654 being scanned. Using the second method, the scan chain is loaded with all zeroes (0's) in the failing region, which results in RML(1:8)='1111000'. The propagation during each of the clock cycles (i.e. cycles 1–8) across the scan chain 600 from scan input 602 is shown in block 720. Next, the scan chain is switched into the operating region and unloaded. The following data is attained: RML(1:8)='1111000'. The output taken from scan output 604 is shown in block 722 after all of the input value of zero has propagated through the scan chain 600. From this data, it may be diagnosed that the DC fail or fault occurs on RML5 408.

When there are multiple DC defects in a scan chain, only the first and last defect in the scan chain can be diagnosed and identified using the two mentioned methods. Although this is useful, if there are multiple defects, for example a third defect at RML 3 which is between defect 652 of RML4 and defect 654 This third defect or inner defect (inner meaning after the first and last defect of a chain) is to be detected by these prior art methods, either separately or combined. Further any multiple defects that occur between a first defect and a last defect are not detected by these prior art method either, again either separately or combined.

Accordingly, there is a need for a method to diagnose and locate all multiple DC defects in a scan chain.

SUMMARY OF THE INVENTION

Methods and system for testing scan chains in integrated circuits. This method enable fast diagnostics for locating failed shift register latches, An aspect of the present invention is to provide a method of testing broken or stuck-at scan chains in an integrated circuit to diagnose and locate failed shift register latches, including the steps of, placing the scan chain circuit into an operating region, loading a scan test pattern into the scan chain, placing the scan chain circuit into a failing region, applying a shift clock pulse to the L2 latch, placing the scan chain circuit into an operating region, and unloading the scan chain.

An aspect of the present invention is to provide a method of testing broken or stuck-at scan chains in an integrated circuit including the steps of, placing the scan chain circuit into an operating region, loading a scan test pattern into the scan chain, placing the scan chain circuit into a failing region, applying a scan clock (also called scan-in clock) pulse to the L1 latch, placing the scan chain circuit into an operating region, applying a shift clock pulse to the L2 latch, and unloading the scan chain.

The foregoing and other features and advantages of the present invention will be apparent from the following more detailed description of the embodiments of the invention, as illustrated in the accompanying drawings.

BRIEF DESCRIPTION OF THE DRAWINGS

The invention will be described in detail with reference to the following drawings in which like reference numerals refer to like elements wherein.

DETAILED DESCRIPTION

Methods for testing scan chains in integrated circuits to diagnose and locate failed shift register latches, according to the present invention, provide a quick and efficient way to identify multiple DC defects in a scan chain.

Such methods may include the steps of placing the scan chain circuit into an operating region, loading a scan test pattern into the scan chain, placing the scan chain circuit into a failing region, applying a shift clock pulse to the L2 (slave) latch, placing the scan chain circuit into an operating region, and unloading the scan chain. An additional step may be added to analyze the resulting data.

Such methods may include the steps of, placing the scan chain circuit into an operating region, loading a scan test pattern into the scan chain circuit, placing the scan chain circuit into a failing region, applying a scan clock pulse to the L1 (master) latch, placing the scan chain circuit into an operating region, applying a shift clock pulse to the L2 latch, and unloading the scan chain. An additional step may be added to analyze the resulting data.

Scan chain circuits such as those shown in FIG. 2 have been shown to be used advantageously with the present invention. Also other scan chain circuits are such as those described in the article entitled "LSSD Scan Design Enhancement for Logic Diagnostics" by author Todd Burdine, published by International Business Machines on Jul. 22, 2003 at IPCOM# 000017002D and available at online URL (www.ip.com) and is hereby incorporated by reference in its entirety.

Figure 8:
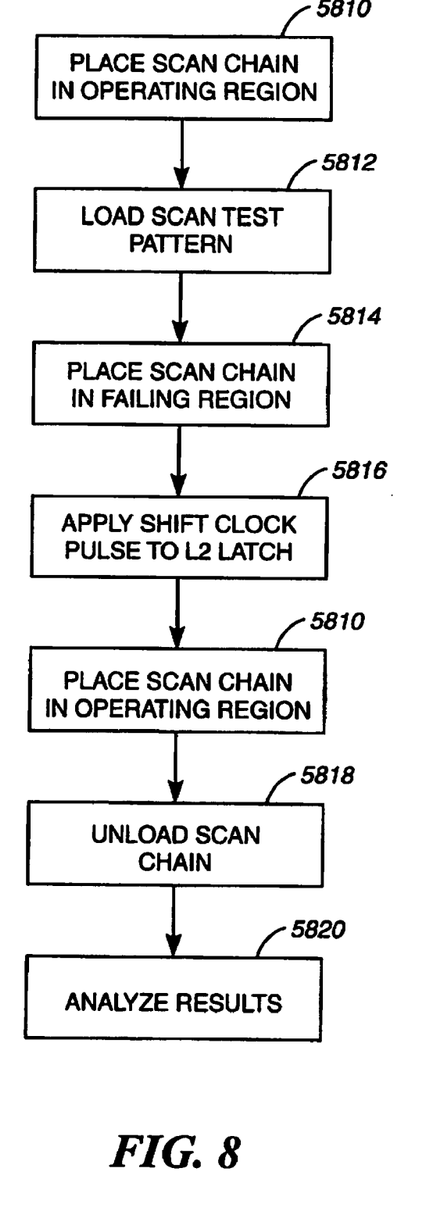
FIG. 8 is a flow chart showing a process for diagnosing scan chains with master or L1 latch DC defects, according to the present invention.

FIG. 8 illustrates a flow chart of a process 800 for diagnosing and locating multiple DC defects in the L1 (master) latches of a scan chain in accordance with an embodiment of the present invention. The process 800 includes the steps of placing the scan chain circuit into an operating region (step S810), loading a scan test pattern into the scan chain (step S812), placing the scan chain circuit into a failing region (step S814), applying a shift clock pulse to the L2 (slave) latch (step S816), placing the scan chain circuit into an operating region (step S810), and unloading the scan chain (step S818). An optional step S820 is provided for analyzing the scan chain results.

Figure 9:
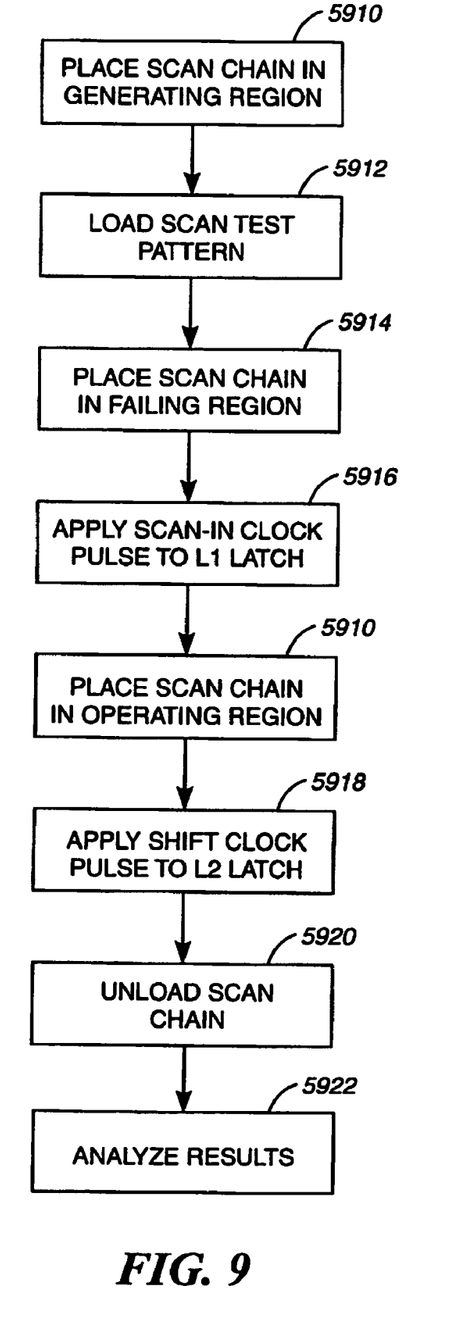
FIG. 9 is a flow chart showing a process for diagnosing scan chains with slave or L2 latch DC defects, according to the present invention.

FIG. 9 shows a flow chart of a process 900 for diagnosing and locating multiple DC defects in the L2 (slave) latches of a scan chain in accordance with an embodiment of the present invention. The process 900 includes the steps of placing the scan chain circuit into an operating region (step S910), loading a scan test pattern into the scan chain (step S912), placing the scan chain circuit into a failing region (step S914), applying a scan clock pulse to the L1 (master) latch (step S916), placing the scan chain circuit into an operating region (step S910), applying a shift clock pulse to the L2 (slave) latch (step S918), and unloading the scan chain (step S920). An optional step S922 is provided for analyzing the scan chain results.

Figure 10:
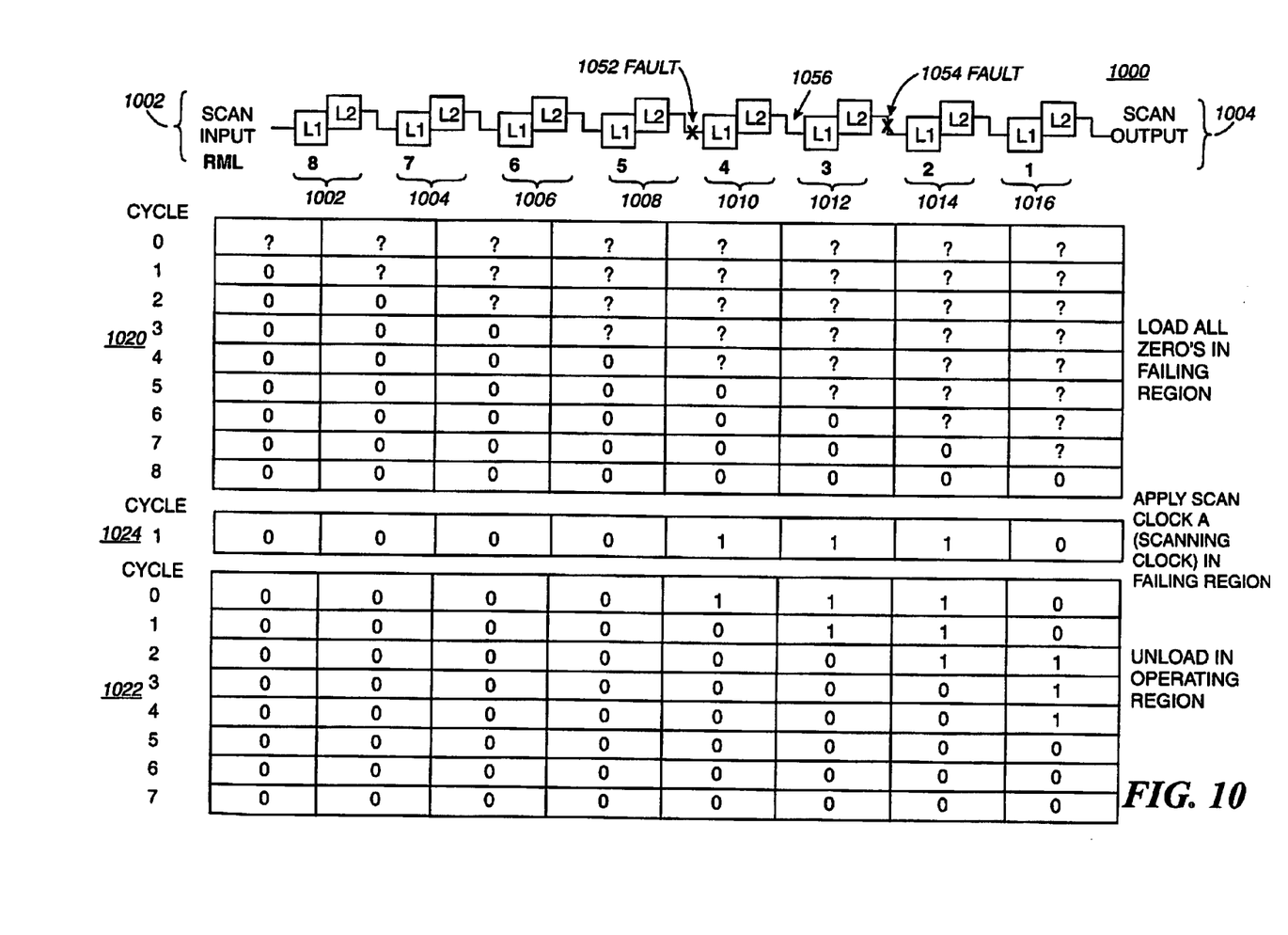
FIG. 10 is a block diagram of an exemplary scan chain circuit with three DC defects at the outputs of RML3, RML4 and RML5, respectively being scanned according to the present invention.

To illustrate the diagnostic methods of FIG. 8 and FIG. 9, we reexamine the scan chain shown in FIG. 6. and FIG. 7 but now with three defects 1052, 1056 and 1054 as shown in FIG. 10. The three defects or faults 1052, 1056 and 1054 at the outputs of RML5 1008, RML4 1010 and RML3 1012 that cause the chain to be stuck-at "1" in the failing region. To diagnose all the faults in the scan chain, one may apply the diagnostic method of FIG. 8, and load the scan chain circuit with all 0's in the operating region (steps S810 and S812). The propagation during each of the clock cycles (i.e. cycles 1–8) across the scan chain 1000 from scan input 1002 is shown in block 1020. Next, the scan chain 1000 t is placed into a failing region and apply a single "b" or "shift" clock (steps S814 and S816). Continuing further, the scan chain 1000 is placed into an operating region and then unloaded (steps S818 and S820). This method results in RML(1:8) ='00000000' which indicates that there are no fails in the L1 latches 310.

Next, one may apply the diagnostic method of FIG. 9, and load the scan chain with all 0's in the operating region (steps S910 and S912), place the scan chain into a failing region and apply a single "a" or "scan-in" clock (steps S914 and S916). Place the scan chain in the operating region, and apply a single "b" or "shift" clock to perform a "skewed" unload of the chain. (steps S918 and S910). A skewed unload is accomplished by applying an extra "b" or "shift" clock before starting an unload of the scan chain. This is shown in block 1024. Similarly, applying an extra "a" or "scan-in" clock after the loading of a scan chain performs a skewed load. In this example, after the skewed unload is performed, the chain is unloaded in the operating region (step S920). The output taken from scan output 204 is shown in block 1022 after the scan test pattern has propagated through the scan chain 1000. The data scanned out will be: RML(2:8) ='0111000'. (The data in RML1 1016 is lost because of the extra "b" or "shift" clock.) This identifies RML5 1008, RML4 1010 and RML3 1012 as the failing latch blocks with stuck at 1 fails.

The first method tests the L1 latches and the second method tests the L2 latches. From this data, it can be concluded that the defect is in the L2 latches (between the input of the next L1 and the output of the previous L1) of RML5 1008, RML4 1010 and RML3 1012. This output data matches the example test faults, which occurred on the output of the L2 latches of RML5 1008, RML4 1010 and RML3 1012. These results and the states of the L1 and L2 latches of each Latch Block RML(1:8) are more fully detailed in the tables provided by FIG. 11 and FIG. 12.

Figure 11:
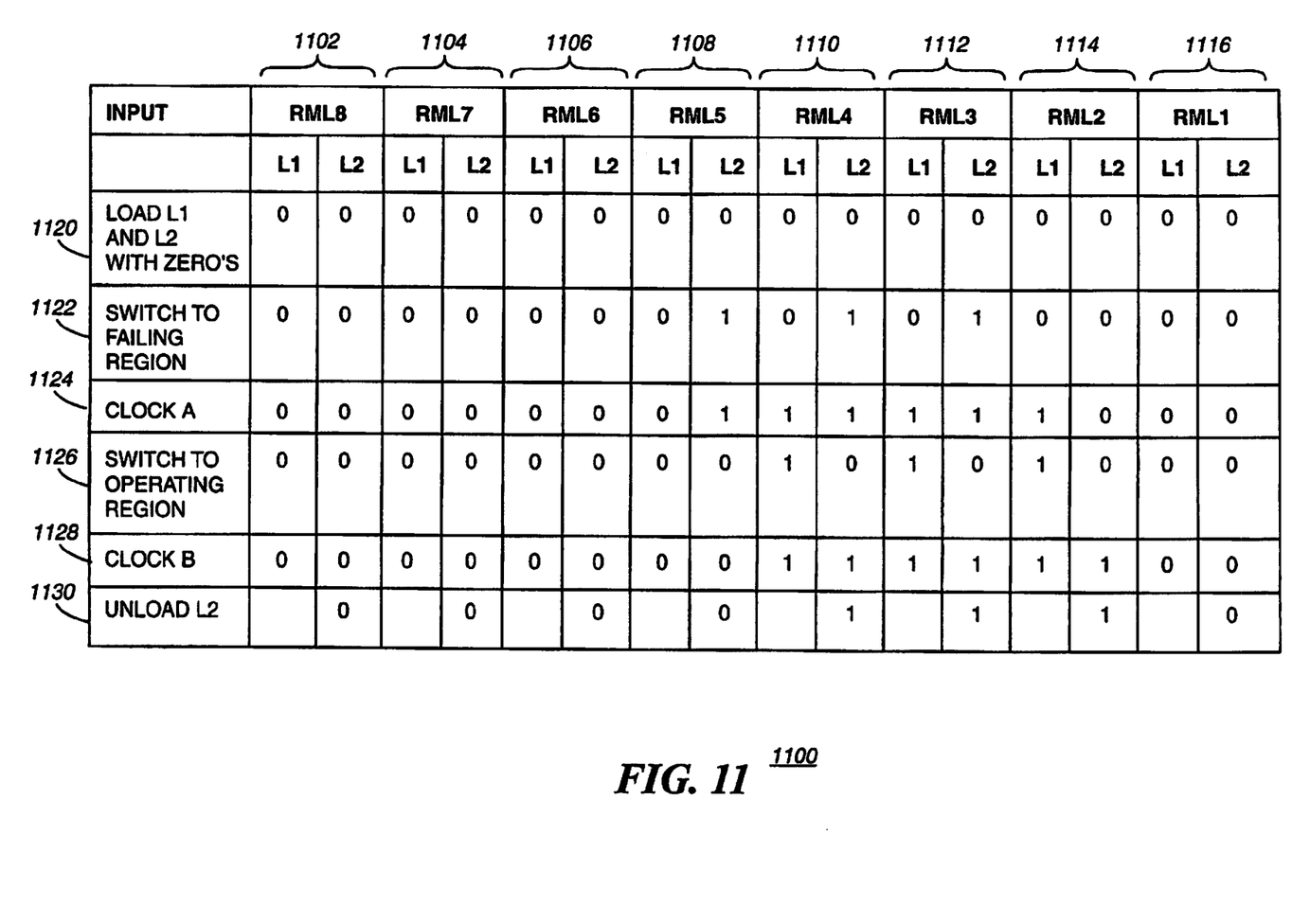
FIG. 11 is an exemplary table illustrating the state of each L1 and L2 latch for each Latch Block RML(1:8) where three DC defects, caused by the respective L2 latch in a stuck at 1 condition are assumed at the outputs of RML3, RML4 and RML5.

FIG. 11 is a table illustrating the state of each L1 and L2 latch for each Latch Block RML(1:8) where three DC defects 1152, 1156 and 1154 caused by the respective L2 latch in a stuck at 1 (HI) condition are assumed at the outputs of RML5 1108, RML4 1110 and RML3 1112, As shown in block 1120, the scan chain 1100 is placed in an active region and L1 and L2 are loading with all 0's. Next, the scan chain 1100 is placed in a failing region as shown in block 1122. When the scan chain 1100 is placed in the failing region, the three defects 1152, 1156 and 1154 assumed at the output of the respective L2 latches will now be present. Block 1124 illustrates the states of the L1 and L2 latch output after Clock A is applied while still in the failing region. The Clock A causes the output of the preceding L2 latch (or scan input) to load into the next L1 latch. Block 1126 illustrates the states of the L1 and L2 latches after the scan chain 1100 is returned to an operating region, which causes the three defects 1152, 1156 and 1154 to no longer be asserted. Block 1128 illustrates that a single Clock B is applied to shift the contents of the L1 latch output into the L2 latch. Finally, block 1130 illustrates the state of the L2 latch outputs for each Latch Block RML(2:8) to be '0111000'. (The data in RML1 1116 is lost because of the extra "b" or "shift" clock.) This identifies RML5 1108, RML4 1110 and RML3 1112 as the failing latch blocks with stuck at 1 fails at the L2 latches.

Figure 12:
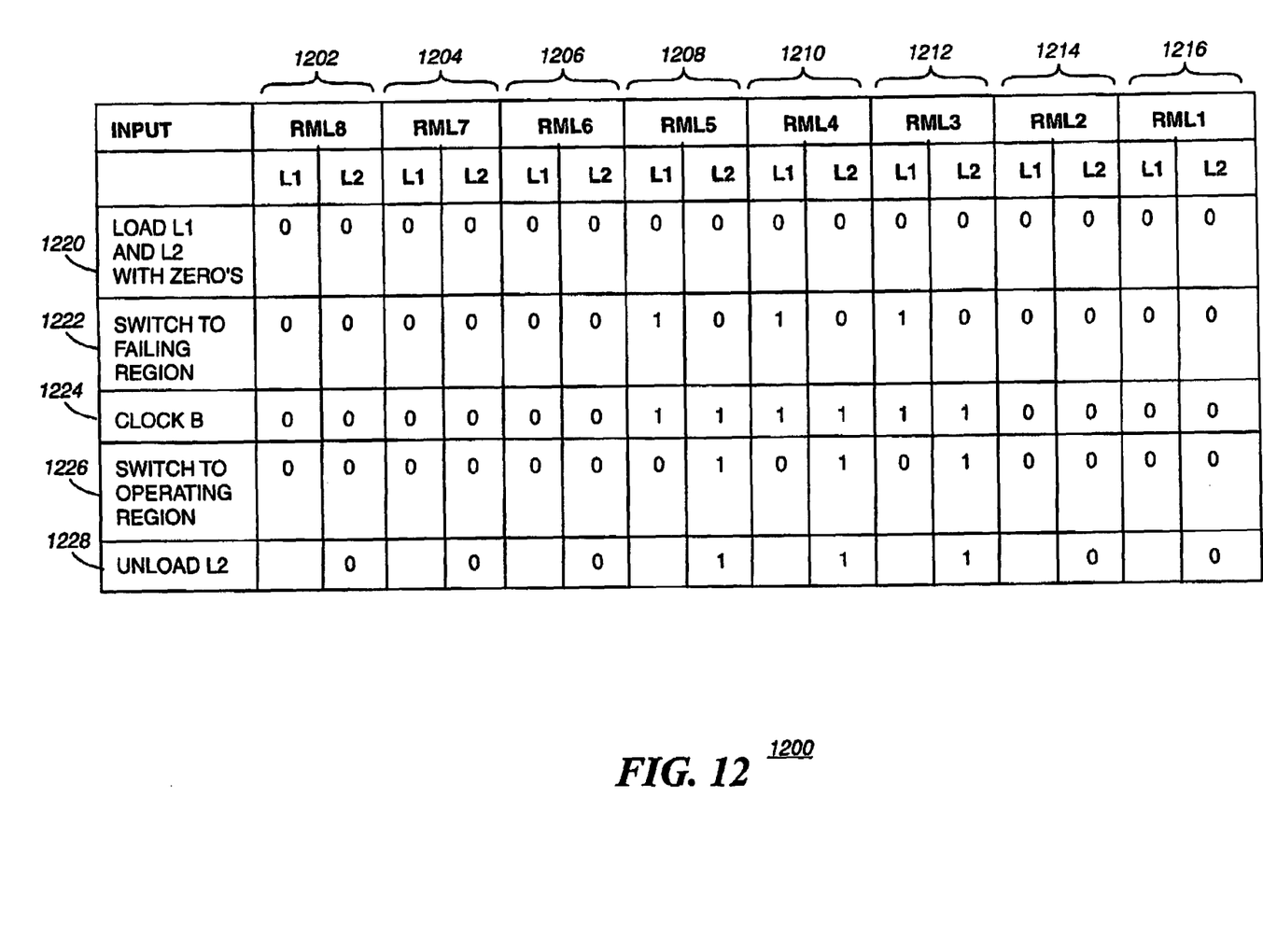
FIG. 12 is an exemplary table illustrating the state of each L1 and L2 latch for each Latch Block RML(1:8) where three DC defects, caused by the respective L1 latch in a stuck at 1 condition are assumed at the outputs of RML3, RML4 and RML5.

FIG. 12 is an exemplary table illustrating the state of each L1 and L2 latch for each Latch Block RML(1:8) where three DC defects 1252, 1256 and 1254, caused by the respective L1 latch in a stuck at 1 (HI) condition are assumed at the outputs of RML5 1208, RML4 1210 and RML3 1212. As shown in block 1220, the scan chain 1200 is placed in an active region and L1 and L2 are loading with all 0's. Next, the scan chain 1200 is placed in a failing region as shown in block 1222. When the scan chain is placed in the failing region, the three defects 1252, 1256 and 1254 assumed at the output of the respective L1 latches will now be present. Block 1224 illustrates the states of the L1 and L2 latch output after Clock B is applied while still in the failing region. Block 1226 illustrates the states of the L1 and L2 latches after the scan chain 1200 is returned to an operating region, which causes the three defects 1252, 1256 and 1254 to no longer be asserted. Finally, block 1228 illustrates the state of the L2 latch outputs for each Latch Block RML(1:8) to be '00111000'. This identifies RML5 1108, RML4 1110 and RML3 1112 as the failing latch blocks with stuck at 1 fails at the L1 latch outputs.

Alternatively, to detect any stuck-at "0" defects in the latch blocks, both methods described in FIGS. 8 and 9, may use a scan test value of "1" instead of "0" for loading into a scan chain. While these exemplary embodiments have loaded the chain scan with scan test patterns of either all 1's or all 0's, the scan test pattern may be any combination of 1's or 0's. Furthermore, these exemplary embodiments have illustrated scan chain circuits with eight latch blocks. There is no limitation on the number of latch blocks to be tested in a scan chain by the methods of this invention. Moreover, deterministic or algorithmic scan test patterns of 1's and 0's may be used. Applying the following successive sequence of '10000000'; '01000000'; '00100000'; '00010000'; '00001000'; '00000100'; '00000010'; '00000001' of "walking" a value of 1 through the scan chain has been shown to be very useful.

It is important to note that using the present invention, multiple defects that occur in a scan chain are found quickly and efficiently by using a "skewed unload" of the scan chain. Further, the defects found are not limited only to a first defect of a scan chain and a last defect of a scan chain but other defects in the middle of the chain are identified as well.

Further, it is important to note that although a method described is for identifying multiple defects for each of the latches L1 and L2 separately, it is possible to combine the techniques described in the present invention to find defects or errors in both the L1 and L2 latches simultaneously. For example, a scan clock (a) on latch 1 and a shift clock (b) on latch 2 can be applied in pairs such as ab, ab-ab, ab-ab-ab, to save time by testing the L1 and L2 latches in pairs.

An embodiment of the present invention can also be embedded in a computer program product, which comprises all the features enabling the implementation of the methods described herein, and which—when loaded in a computer system—is able to carry out these methods for analyzing the scan chain. Computer program means or computer program in the present context means any expression, in any language, code or notation, of a set of instructions intended to cause a system having an information processing capability to perform a particular function either directly or after either or both of the following a) conversion to another language, code or, notation; and b) reproduction in a different material form.

A computer system may include, inter alia, one or more computers and at least a computer readable medium, allowing a computer system, to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer readable medium may include, for example, volatile storage such as RAM, buffers, cache memory, and network circuits. Furthermore, the computer readable medium may comprise computer readable information in a transitory state medium such as a network link and/or a network interface, including a wired network or a wireless network, that allows a computer system to read such computer readable information.

Although several embodiments of the present invention and its advantages have been described in detail, it should be understood that changes, substitutions, transformations, modifications, variations, permutations and alterations may be made therein without departing from the teachings of the present invention, the spirit and the scope of the invention being set forth by the appended claims.

What is claimed is:

1. A method of identifying one or more defective shift register latches in a scan chain, the method comprising:
   electrically coupling a plurality of shift register latches into a series configuration so as to form a scan chain circuit, wherein each of the shift register latches includes a first latch and a second latch connected in a master-slave configuration, wherein each of the first latch and second latch includes at least one clock input;
   placing the scan chain circuit into an operating region;
   loading a scan test pattern into the scan chain circuit;
   placing the scan chain circuit into a failing region;
   applying a shift clock pulse to the clock input of the second latch, wherein the shift clock pulse is applied while the scan chain circuit is in the failing region;
   placing the scan chain circuit into an operating region;
   unloading the scan chain circuit; and
   identifying at least one defective shift register latch in the scan chain circuit.

2. The method of claim 1, further comprising:
   analyzing output from the scan chain circuit after the unloading.

3. The method of claim 1, wherein the loading a scan test pattern into the scan chain circuit includes loading a scan test pattern of all zeroes.

4. The method of claim 1, wherein the loading a scan test pattern into the scan chain circuit includes loading of all ones.

5. The method of claim 1, wherein the loading a scan test pattern into the scan chain circuit includes loading zero and ones.

6. The method of claim 5, wherein the loading a scan test pattern into the scan chain circuit includes loading an algorithmic scan test pattern.

7. The method of claim 1, wherein the unloading comprises:
   applying a scan clock pulse to the clock input of the first latch and a shift clock pulse to the input of the second latch, wherein the scan pulse and the shift clock pulse are applied while the scan chain circuit is in the operating region;
   measuring an output of the second latch against an expected response;
   recording the output;
   checking whether the scan chain circuit has been completed; and
   repeating the applying the scan clock pulse and the shift clock pulse, the measuring the output of the second latch, and the recording until the scan chain circuit is completed.

8. A method of identifying one or more defective shift register latches in a scan chain, the method comprising:
   electrically coupling a plurality of shift register latches into a series configuration so as to form a scan chain circuit, wherein each of the shift register latches includes a first latch and a second latch connected in a master-slave configuration, wherein each of the first latch and second latch includes at least one clock input;
   placing the scan chain circuit into an operating region;
   loading a scan test pattern into the scan chain circuit;
   placing the scan chain circuit into a failing region;
   applying a scan clock pulse to the clock input of the first latch, wherein the scan clock pulse is applied while the scan chain circuit is in the failing region;
   placing the scan chain circuit into an operating region;
   applying a shift clock pulse to the clock input of the second latch, wherein the shift clock pulse is applied while the scan chain circuit is in the operating region;
   unloading the scan chain circuit; and
   identifying at least one defective shift register latch in the scan chain circuit.

9. The method of claim 8, further comprising:
   analyzing output from the scan chain circuit after the unloading the scan chain.

10. The method of claim 8, wherein the loading a scan test pattern into the scan chain circuit includes loading a scan test pattern of all zeroes.

11. The method of claim 8, wherein the loading a scan test pattern into the scan chain circuit includes loading a scan test pattern of all ones.

12. The method of claim 8, wherein the loading a scan test pattern into the scan chain circuit includes loading zero and ones.

13. The method of claim 12, wherein the loading a scan test pattern into the scan chain circuit includes loading an algorithmic scan test pattern.

14. The method of claim 8, wherein the unloading comprises:
   applying a scan clock pulse to the clock input of the first latch and a shift clock pulse to the input of the second latch, wherein the scan pulse and the shift clock pulse are applied while the scan chain circuit is in the operating region;
   measuring an output of the second latch against an expected response;
   recording the output;
   checking whether the scan chain circuit has been completed; and
   repeating the applying the scan clock pulse and the shift clock pulse, the measuring the output of the second latch, and the recording until the scan chain circuit is completed.

15. A method of identifying one or more defective shift register latches in a scan chain, the method comprising:
   electrically coupling a plurality of shift register latches into a series configuration so as to form a scan chain circuit, wherein each of the shift register latches includes a first latch and a second latch connected in a master-slave configuration, wherein each of the first latch and second latch includes at least one clock input;
   placing the scan chain circuit into an operating region;
   loading a scan test pattern into the scan chain circuit;
   placing the scan chain circuit into a failing region;
   applying a scan clock pulse to the clock input of the first latch, wherein the scan clock pulse is applied while the scan chain circuit is in the failing region;
   applying a shift clock pulse to the clock input of the second latch, wherein the shift clock pulse is applied while the scan chain circuit is in the failing region;
   placing the scan chain circuit into an operating region;
   unloading the scan circuit; and
   identifying at least one defective shift register latch in the scan chain circuit.

16. The method of claim 15, further comprising:
   applying a shift clock pulse to the clock input of the second latch prior to unloading the latch.

17. The method of claim 15, wherein the loading a scan test pattern into the scan chain circuit includes loading a scan test pattern of all zeroes.

18. The method of claim 15, wherein the loading a scan test pattern into the scan chain circuit includes loading a scan test pattern of all ones.

19. The method of claim 15, wherein the loading a scan test pattern into the scan chain circuit includes loading zero and ones.

20. The method of claim 19, wherein the loading a scan test pattern into the scan chain circuit includes loading an algorithmic scan test pattern.

21. A computer program product containing programming instructions for identifying one or more defective shift register latches in a scan chain, wherein each of the shift register latches includes a first latch and a second latch connected in a master-slave configuration, wherein each of the first latch and second latch includes at least one clock input, the programming instructions comprising:
   placing the scan chain circuit into an operating region;
   loading a scan test pattern into the scan chain circuit;
   placing the scan chain circuit into a failing region:
   applying a shift clock pulse to the clock input of the second latch, wherein the shift clock pulse is applied while the scan chain circuit is in the operating region
   placing the scan chain circuit into an operating region;
   unloading the scan circuit; and
   identifying at least one defective shift register latch in the scan chain circuit.

22. A computer program product containing programming instructions for identifying one or more defective shift register latches in a scan chain, wherein each of the shift register latches includes a first latch and a second latch connected in a master-slave configuration, wherein each of the first latch and second latch includes at least one clock input, the programming instructions comprising:
   placing the scan chain circuit into an operating region;
   loading a scan test pattern into the scan chain circuit;
   placing the scan chain circuit into a failing region;
   applying a scan lock pulse to the clock input of the first latch, wherein the scan clock pulse is applied while the scan chain circuit is in the operating region;
   applying a shift clock pulse to the clock input of the second latch, wherein the shift clock pulse is applied while the scan chain circuit is in the operating region;
   placing the scan chain circuit into an operating region;
   unloading the scan circuit; and
   identifying at least one defective shift register latch in the scan chain circuit.

* * * * *

UNITED STATES PATENT AND TRADEMARK OFFICE
CERTIFICATE OF CORRECTION

| | | |
|---|---|---|
| PATENT NO. | : 7,107,502 B2 | Page 1 of 1 |
| APPLICATION NO. | : 10/767046 | |
| DATED | : September 12, 2006 | |
| INVENTOR(S) | : Todd Michael Burdine | |

It is certified that error appears in the above-identified patent and that said Letters Patent is hereby corrected as shown below:

Title Page 1, Col. 1, Line Item (57), should read as follows:

ABSTRACT

Methods of testing scan chains in integrated circuits are provided. One method may include steps of placing the scan chain circuit into an operating region, loading a scan test pattern into the scan chain, placing the scan chain circuit into a failing region, applying a shift clock pulse to the L2 (slave) latch, placing the scan chain circuit into an operating region, and unloading the scan chain. An additional step may be added to analyze the resulting data. Another method may include the steps of, placing the scan chain circuit into an operating region, loading a scan test pattern into the scan chain circuit, placing the scan chain circuit into a failing region, applying a scan clock pulse to the L1 (master) latch, placing the scan chain circuit into an operating region, applying a shift clock pulse to the L2 latch, and unloading the scan chain. An additional step may be added to analyze the resulting data.

22 Claims, 10 Drawing Sheets

Signed and Sealed this

Twenty-seventh Day of March, 2007

JON W. DUDAS
*Director of the United States Patent and Trademark Office*